United States Patent
Kong

(10) Patent No.: US 7,847,563 B2
(45) Date of Patent: Dec. 7, 2010

(54) TEST SYSTEM

(75) Inventor: Xiang-Yun Kong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 325 days.

(21) Appl. No.: 12/198,328

(22) Filed: Aug. 26, 2008

(65) Prior Publication Data
US 2009/0261834 A1 Oct. 22, 2009

(30) Foreign Application Priority Data
Apr. 18, 2008 (CN) .......... 2008 2 0300588

(51) Int. Cl.
*H01J 1/60* (2006.01)
*G01R 31/00* (2006.01)
*F21S 4/00* (2006.01)

(52) U.S. Cl. .......... 324/557; 315/129; 324/403; 362/249.01

(58) Field of Classification Search .......... 315/129, 315/185 R; 324/403, 557; 362/249.01, 249.02, 362/800; 313/10; 314/9; 340/500
See application file for complete search history.

(56) References Cited

U.S. PATENT DOCUMENTS
2007/0217209 A1* 9/2007 Wong .......... 362/418

* cited by examiner

*Primary Examiner*—Melissa J Koval
*Assistant Examiner*—Farhana Hoque
(74) *Attorney, Agent, or Firm*—Clifford O. Chi

(57) ABSTRACT

A test system includes a front bezel of an electronic device and a test device. The front bezel includes a plurality of positions defined in the front bezel, a plurality of light emitting diodes (LEDs) located in the plurality of positions, and a female LED connector connected to the plurality of LEDs. The test device includes a male LED connector electrically connected to the female LED connector, and a programmable logic device (PLD) electrically connected to the male LED connector, and configured to control the LEDs to emit light in a sequence to determine if the plurality of LEDs are correctly located in the correct plurality of positions.

6 Claims, 6 Drawing Sheets

TEST SYSTEM

BACKGROUND

1. Technical Field

The present invention relates to test systems, and more particularly to a test system for testing light-emitting diodes (LEDs) of a front bezel of an electronic device.

2. Description of the Related Art

Some electronic devices such as a personal computer system or a server, may have many LEDs for showing working status of different parts of the system, such as a hard disk drive and a DVD player. Typically, the LEDs are installed manually, increasing the likelihood that an LED is installed in the wrong position. For example, an LED that is intended to indicate the working status of the DVD player may be inadvertently installed in a position that would indicate a working status of the hard disk drive.

What is needed, therefore, is a test device capable of indicating if an LED has been installed in the wrong position of a electronic device.

DETAILED DESCRIPTION OF THE EMBODIMENTS

Figure 1:
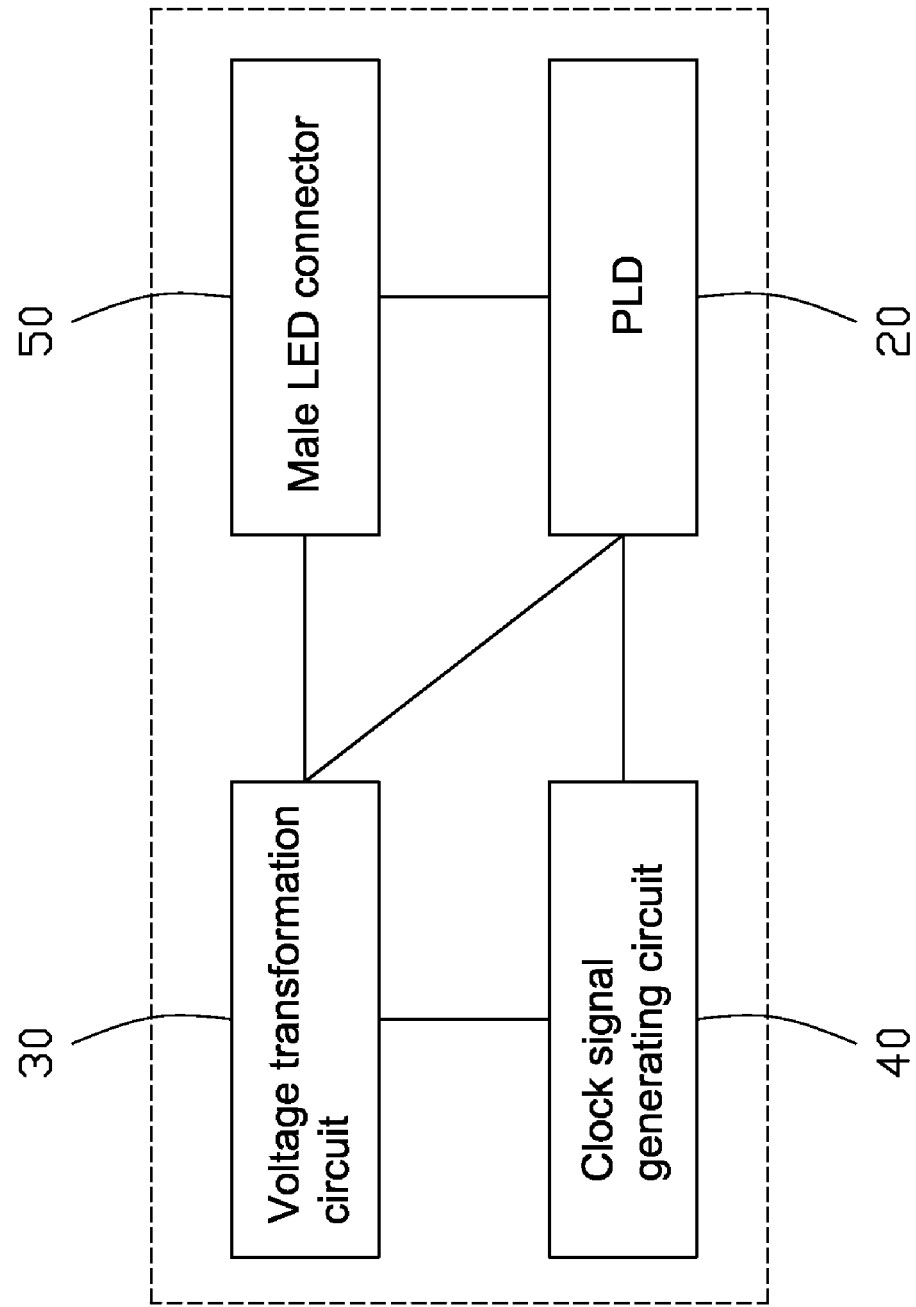
FIG. 1 is a block diagram of an embodiment of a test device, the test device including a programmable logic device (PLD), a voltage transformation circuit, and a clock signal generating circuit.

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

Figure 2:
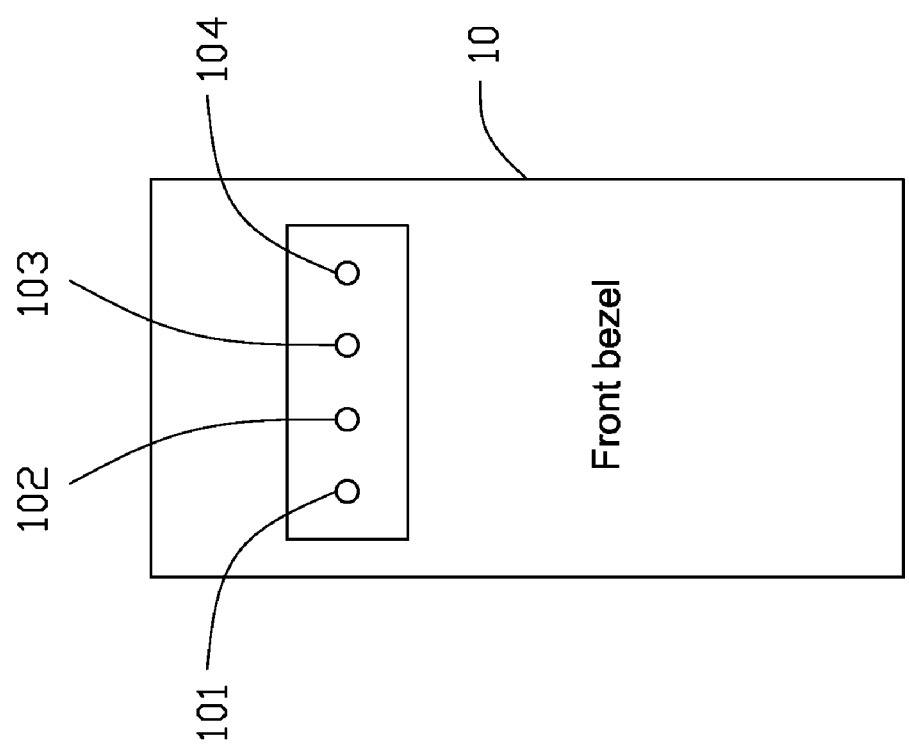
FIG. 2 is a front view of a front bezel of an electronic device of this embodiment, the front bezel defining a plurality of positions for receiving LEDs.

Referring to FIGS. 1 and 2, a test system includes a test device and a front bezel 10 of an electronic device, such as a personal computer system or a server. The test device is configured for testing if light-emitting diodes (LEDs) are correctly positioned in the front bezel 10.

As shown in FIG. 1, an embodiment of the test device includes a programmable logic device (PLD) 20, a voltage transformation circuit 30, a clock signal generating circuit 40, and a male LED connector 50. The voltage transformation circuit 30 is electrically connected to the PLD 20, the clock signal generating circuit 40, and the male LED connector 50, and is configured for transforming a voltage supplied by a power supply (not shown) to suitable work voltages for the PLD 20, the clock signal generating circuit 40, and the male LED connector 50. The clock signal generating circuit 40 is connected to and provides a clock signal to the PLD 20. The male LED connector 50 is electrically connected to the PLD 20, and has a plurality of legs (not shown).

Figure 3:
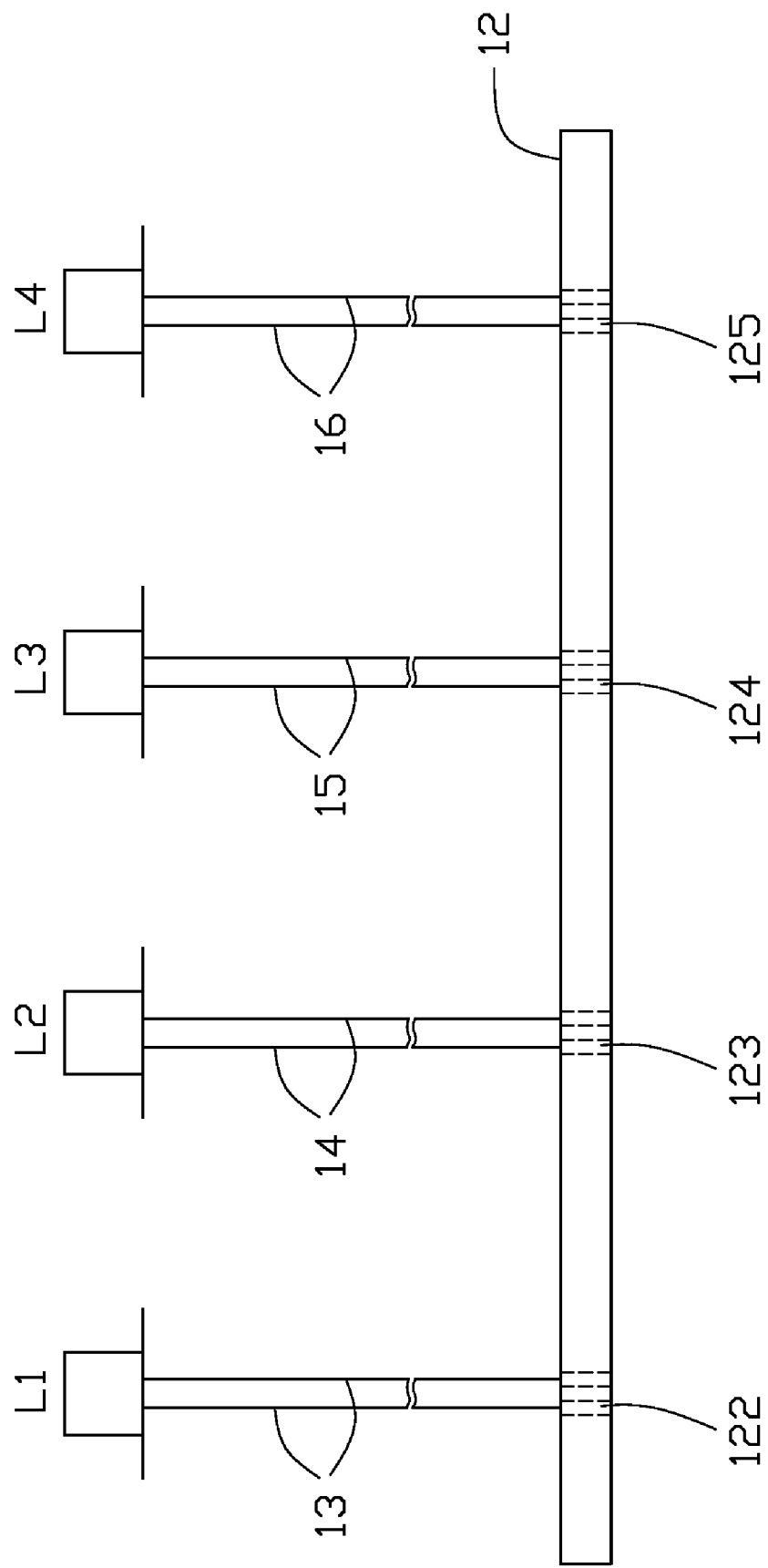
FIG. 3 is a side view of the LEDs of this embodiment, showing the LEDs connected to a female LED connector.

Referring also to FIG. 3, in one embodiment, for exemplary purposes, the male LED connector 50 has a first pair of legs, a second pair of legs, a third pair of legs, and a fourth pair of legs. The PLD 20 is configured for being programmed to control LEDs connected to the pairs of legs to emit light in a pre-determined sequence starting with the LED connected to the first pair of legs of the male LED connector 50 and ending with the LED connected to the fourth pair of legs.

Referring to FIG. 2, in one embodiment, the front bezel 10 defines a first position 101, a second position 102, a third position 103, and a fourth position 104 for receiving LEDs thereon.

Figure 5:
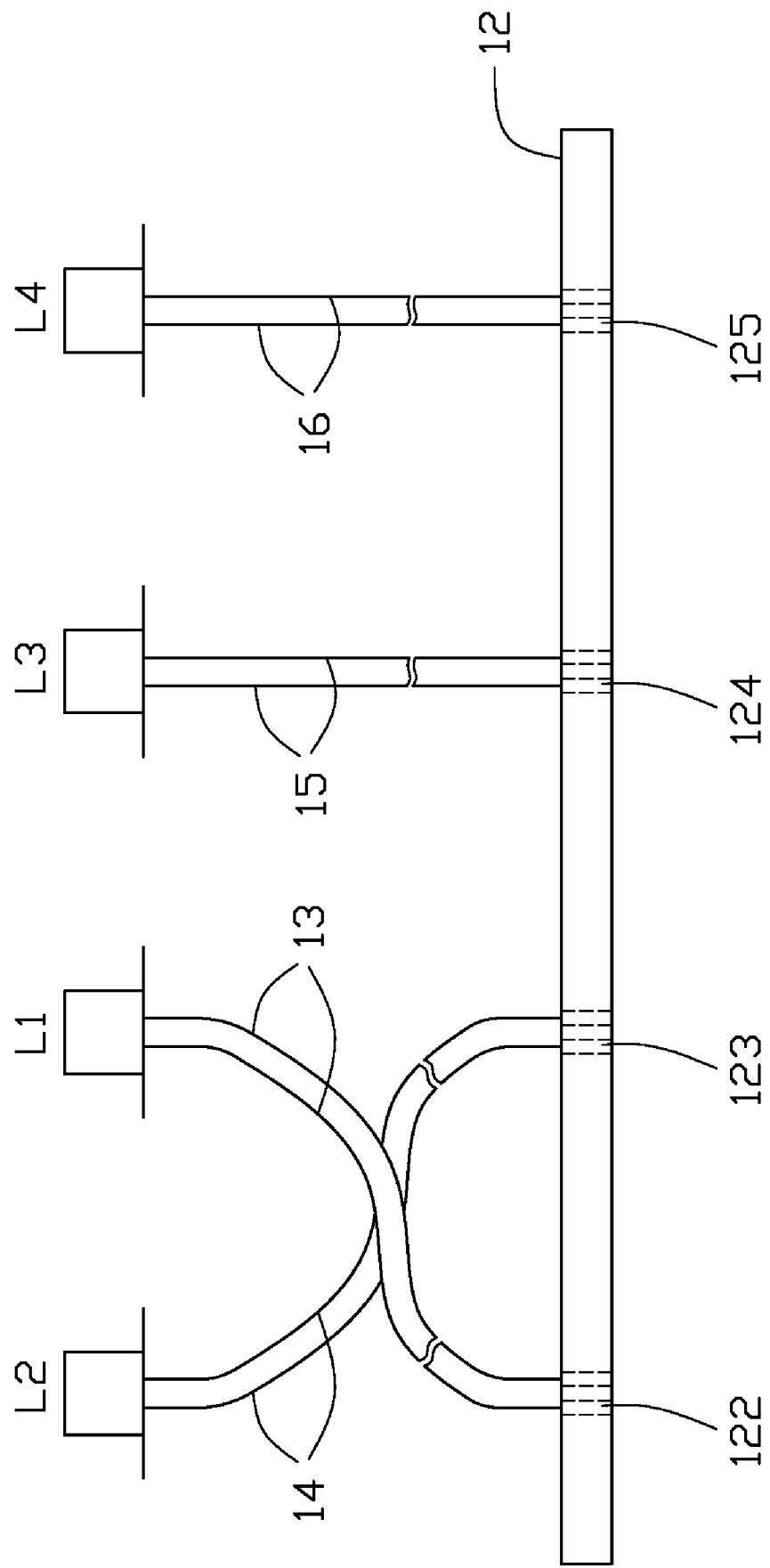
FIG. 5 is similar to FIG. 3, but showing the positions of LED L1 and L2 being exchanged.

Referring also to FIGS. 3 and 5, four LEDs L1, L2, L3, L4 are respectively connected to a female LED connector 12 of the front bezel 10 via a first pair of plug slots 122, a second pair of plug slots 123, a third pair of plug slots 124, and a fourth pair of plug slots 125. The LEDs L1, L2, L3, L4 are respectively, electrically connected to the first, second, third, and fourth plug slots 122, 123, 124, and 125 by cables 13, 14, 15, and 16. If the LEDs L1, L2, L3, L4 are installed in their correct positions in the front bezel 10, the LED L1 is electrically connected to the first pair of legs of the male LED connector 50 and located in the first position 101, the LED L2 is electrically connected to the second pair of legs of the male LED connector 50 and located in the second position 102, the LED L3 is electrically connected to the third pair of legs of the male LED connector 50 and located in the third position 103, and the LED L4 is electrically connected to the fourth pair of legs of the male LED connector 50 and located in the fourth position 104.

Figure 4:
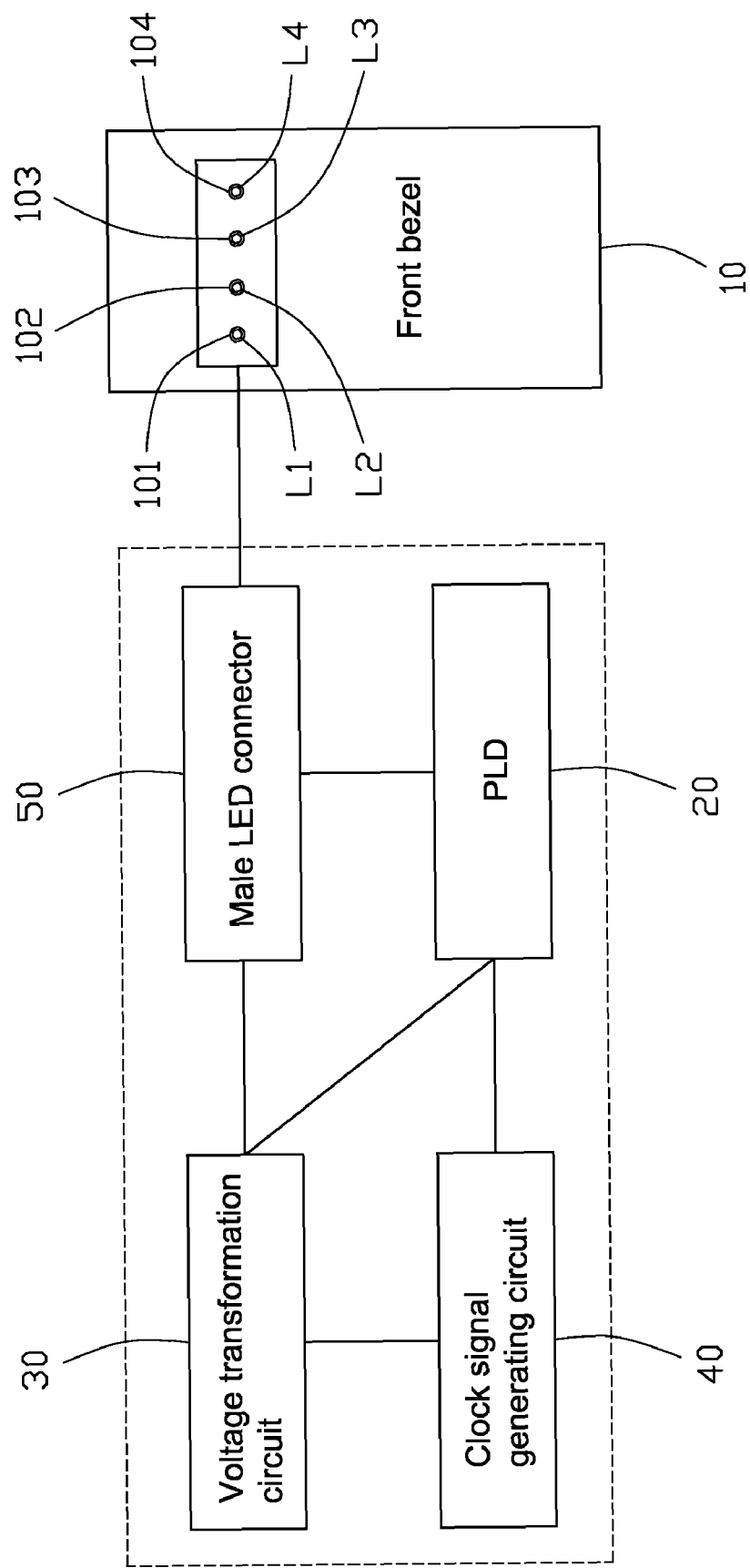
FIG. 4 is an assembled view of the test device of FIG. 1, the front bezel of FIG. 2, and the LEDs of FIG. 3, showing the LEDs installed in their correct positions in the front bezel and the female LED connector connected to a male LED connector.

Referring also to FIG. 4, the LEDs L1, L2, L3, L4 are installed in the first, second, third, and fourth positions 101, 102, 103, and 104 in the front bezel 10. Then, the first, second, third, and fourth pairs of legs of the male LED connector 50 are respectively inserted into the corresponding first, second, third, and fourth pairs of plug slots 122, 123, 124, and 125. Accordingly, the LEDs L1, L2, L3, L4 are respectively, electrically connected to the first, second, third, and fourth pairs of legs of the male LED connector 50.

Power is supplied to the test device to test the position of the LEDs L1, L2, L3, L4. The clock signal generating circuit 40 sends clock signals to the PLD 20. The PLD 20 controls the LEDs L1, L2, L3, L4 to emit light in an order according to the clock signals.

Figure 6:
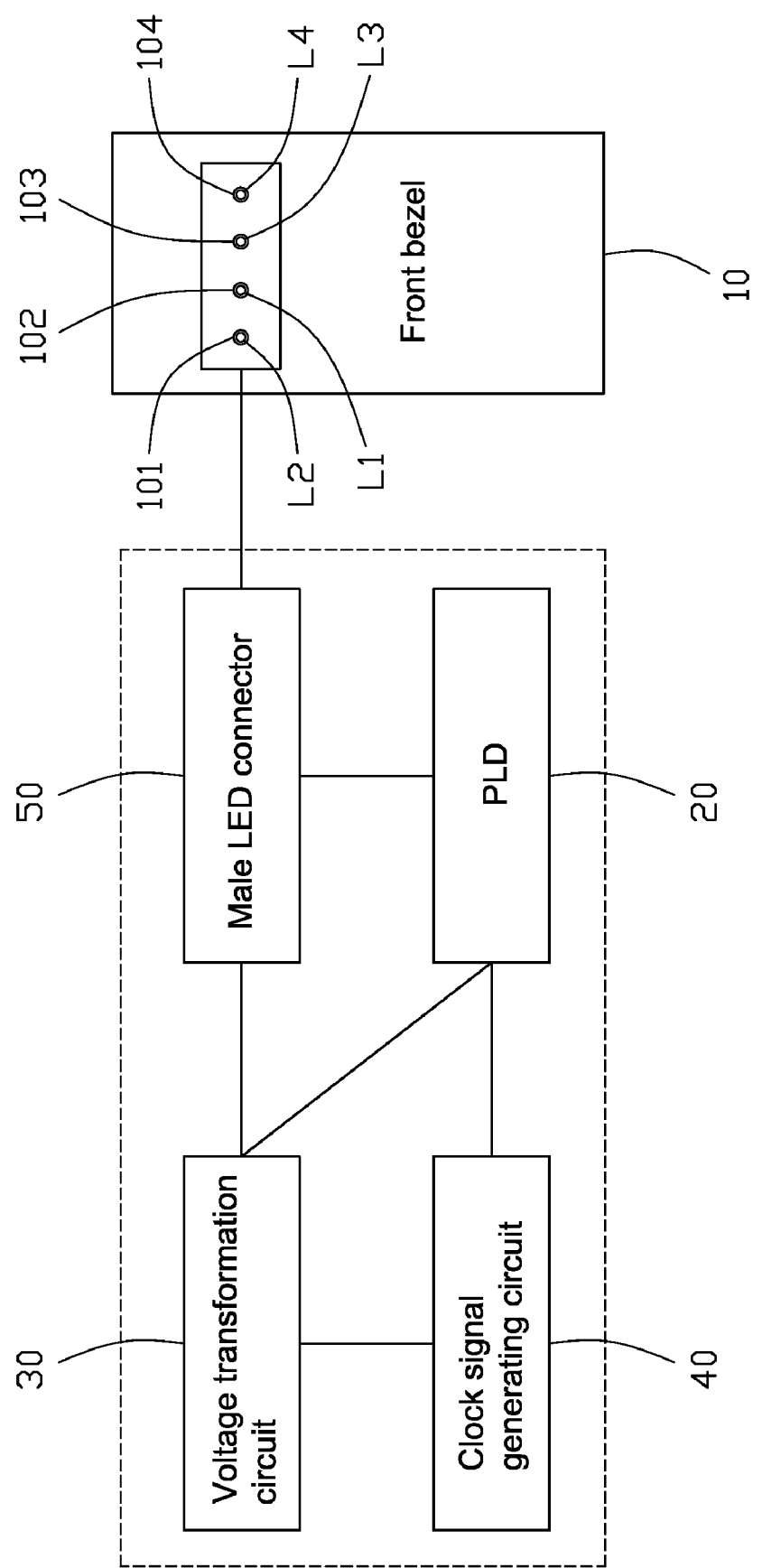
FIG. 6 is similar to FIG. 4, but showing the positions of LED L1 and L2 being exchanged.

Since the PLD 20 is programmed to determine the light emitting order of the LEDs L1, L2, L3, L4, then if the LEDs L1, L2, L3, L4 emit light in the sequence starting from the first position 101, and continuing to the second position 102, the third position 103, and to the fourth position 104 of the front bezel 10, it can be determined that the LEDs L1, L2, L3, L4 are located in the correct positions, i.e. the LED L1 is positioned in the first position 101, the LED L2 is positioned in the second position 102, the LED L3 is positioned in the third position, and the LED L4 is positioned in the fourth position, as shown in FIG. 4. If the LEDs L1, L2, L3, and L4 emit light that is not in sequence, for example, in another sequence starting from the second position 102, and continuing to the first position 101, the third position 103, and to the fourth position 104 of the front bezel 10, it can be determined that the LEDs L1, L2, L3, L4 are located in the wrong position. For example, the LED L1 is positioned in the second position 102, the LED L1 is positioned in the first position 101, the LED L3 is positioned in the third position, and the LED L4 is positioned in the fourth position, as shown in FIG. 6. The test device makes it very easy to determine that the positions of LEDs L1, L2 should exchange positions, as shown in FIG. 5.

As described above, the test device makes it very easy to determine if the positions of the LEDs located at the front bezel 10 are in the correct position, and quickly make corrections if necessary.

It is to be understood, however, that even though numerous characteristics and advantages have been set forth in the foregoing description of embodiments, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A test system, comprising:
   a front bezel of an electronic device comprising:
      a plurality of positions defined in the front bezel;
      a plurality of light emitting diodes (LEDs) located in the plurality of positions; and
      a female LED connector connected to the plurality of LEDs;
   a test device comprising:
      a male LED connector electrically connected to the female LED connector; and
      a programmable logic device (PLD) electrically connected to the male LED connector, and configured to control the LEDs to emit light in a sequence to determine if the plurality of LEDs are correctly located in the correct plurality of positions.

2. The test system of claim 1, further comprising a voltage transformation circuit electrically connecting a power supply to the PLD and the male LED connector, for supplying work voltages to the PLD and the male LED connector.

3. The test system of claim 2, further comprising a clock signal generating circuit electrically connected to the voltage transformation circuit and the PLD, wherein the PLD controls the sequence of the LEDs to emit light according to clock signals generated from the clock signal generating circuit.

4. A test system, comprising:
   a front bezel of an electronic device comprising:
      a plurality of positions defined in the front bezel; and
      a plurality of LEDs located in the plurality of positions;
   a LED connector electrically connected to the LEDs; and
   a PLD electrically connected to the LED connector, and configured to control the LEDs to emit light in a sequence to determine if the plurality of LEDs are correctly located in the correct plurality of positions.

5. The test system of claim 4, further comprising a voltage transformation circuit electrically connecting a power supply to the PLD, and the LED connector, for supplying work voltages to the PLD and the LED connector.

6. The test system of claim 5, further comprising a clock signal generating circuit electrically connected to the voltage transformation circuit and the PLD, wherein the PLD controls the sequence of the LEDs to emit light according to clock signals generated from the clock signal generating circuit.

* * * * *